United States Patent [19]
Chun

[11] Patent Number: 5,905,392
[45] Date of Patent: May 18, 1999

[54] AUTO-REFRESH CONTROL CIRCUIT FOR SEMICONDUCTOR DEVICE

[75] Inventor: Jun-Hyun Chun, Cheongju, Rep. of Korea

[73] Assignee: LG Semicon Co., Ltd., Choongcheongbuk-Do, Rep. of Korea

[21] Appl. No.: 08/962,318

[22] Filed: Oct. 31, 1997

[30]  Foreign Application Priority Data

Apr. 15, 1997 [KR]  Rep. of Korea ...................... 97-13813

[51] Int. Cl.⁶ ...................................................... H03K 3/02
[52] U.S. Cl. ............................................ 327/198; 327/172
[58] Field of Search ..................................... 327/141, 142, 327/143, 144, 172, 173, 174, 175, 176, 198, 199, 215, 217

[56]  References Cited

U.S. PATENT DOCUMENTS

5,475,646  12/1995  Ogihara ..................................... 365/222

*Primary Examiner*—Timothy P. Callahan
*Assistant Examiner*—Jeffrey Zweizig
*Attorney, Agent, or Firm*—Morgan, Lewis & Bockius LLP

[57]  ABSTRACT

An auto-refresh control circuit for a semiconductor device includes a burn-in signal generator detecting a burn-in test state and generating a burn-in signal and a synchronous buffer receiving a clock signal and an external signal and generating an asynchronous signal and a synchronous signal corresponding to the external signal, the synchronous buffer synchronizing the asynchronous signal to the clock signal. A decoder, coupled to the synchronous buffer, receives control signals and the synchronous signal synchronized to the clock signal from the synchronous buffer and outputs a refresh signal. A refresh control signal generator, coupled to the burn-in signal generator, synchronous buffer, and the decoder, receives the refresh signal, the burn-in signal, and the asynchronous signal and generates an auto-refresh control signal.

21 Claims, 7 Drawing Sheets

FIG. 5A CONVENTIONAL ART CLK
FIG. 5B CONVENTIONAL ART Command
FIG. 5C CONVENTIONAL ART RASB
FIG. 5D CONVENTIONAL ART REFC (Normal)
FIG. 5E CONVENTIONAL ART REFC (Burn-in)

AUTO-REFRESH CONTROL CIRCUIT FOR SEMICONDUCTOR DEVICE

BACKGROUND OF THE INVENTION

1. Field of the Invention

The present invention relates to a semiconductor device, and more particularly, to an auto-refresh control circuit for a semiconductor device.

2. Description of the Related Art

Generally, the auto-refresh operation of a synchronous memory is very similar to a CBR (CAS-Before-RAS) refresh operation of an asynchronous memory. Namely, in the auto-refresh operation of the synchronous memory, a row address counter is operated whenever an auto-refresh command signal is inputted thereinto, and the signals are sequentially refreshed without using an externally inputted address signal. At this time, a minimum period of the auto-refresh cycle is previously set. Therefore, the circuit is configured so that the auto-refresh operation is performed within a previously set time.

In addition, during the semiconductor fabrication process, a burn-in test, namely, a high temperature and high voltage acceleration operation test, is performed in order to check for a defective product. During the burn-in test, an auto-refresh time is generally used.

The auto-refresh control circuit which is used during the burn-in test needs a control by which an extended memory array activation is made possible for a more effective control and test time saving unlike the operation in the normal mode.

Figure 1:
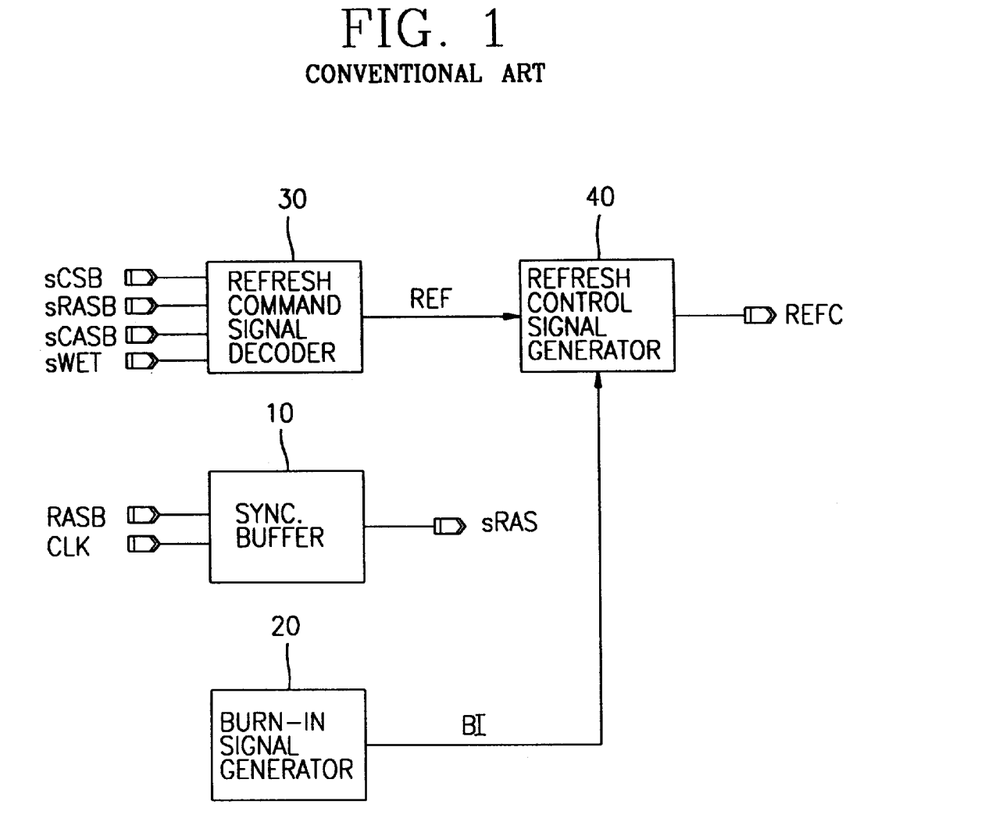
FIG. 1 is a block diagram illustrating a conventional auto-refresh control circuit.

FIG. 1 illustrates a conventional auto-refresh control circuit. Referring to FIG. 1, the conventional auto-refresh control circuit includes a synchronous buffer 10 for outputting a synchronous signal by synchronizing an externally inputted command signal RASB to a clock signal CLK, a burn-in signal generator 20 for detecting a burn-in test state and generating a burn-in signal BI, an auto-refresh command signal decoder 30 for receiving and decoding command signals sCSB, sRASB, sCASB, and sWET which are synchronized by a clock signal, and a refresh control signal generator 40 enabled by a burn-in signal BI from the burn-in signal generator 20, for generating a refresh control signal REFC in accordance with a refresh signal REF from the command signal decoder 30.

Figure 2:
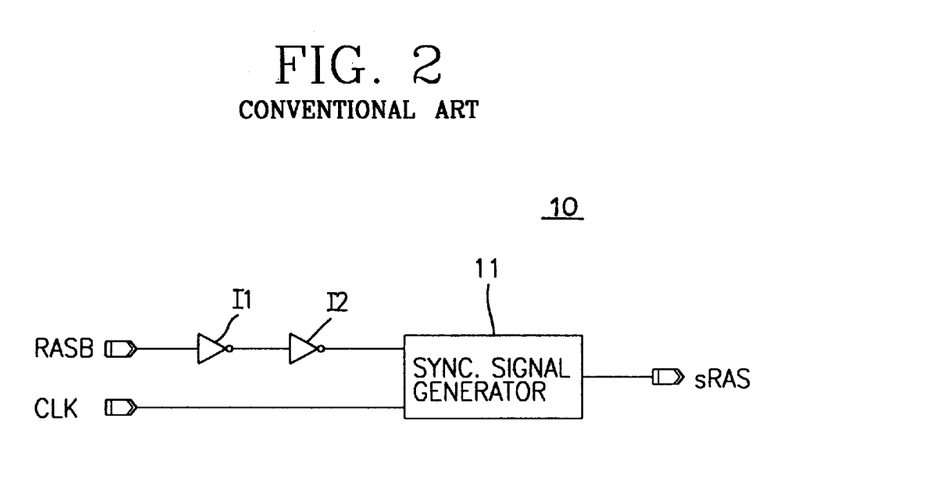
FIG. 2 is a detailed circuit diagram illustrating a synchronous buffer in the circuit of FIG. 1.

As shown in FIG. 2, the synchronous buffer 10 includes inverters I1 and I2, connected in series to each other, for sequentially delaying externally inputted command signals RASB, and a synchronous signal generator 11 for outputting a synchronous signal sRAS by synchronizing the command signal RASB, which are inputted thereinto through the inverters I1 and I2, to the clock signal.

Figure 3:
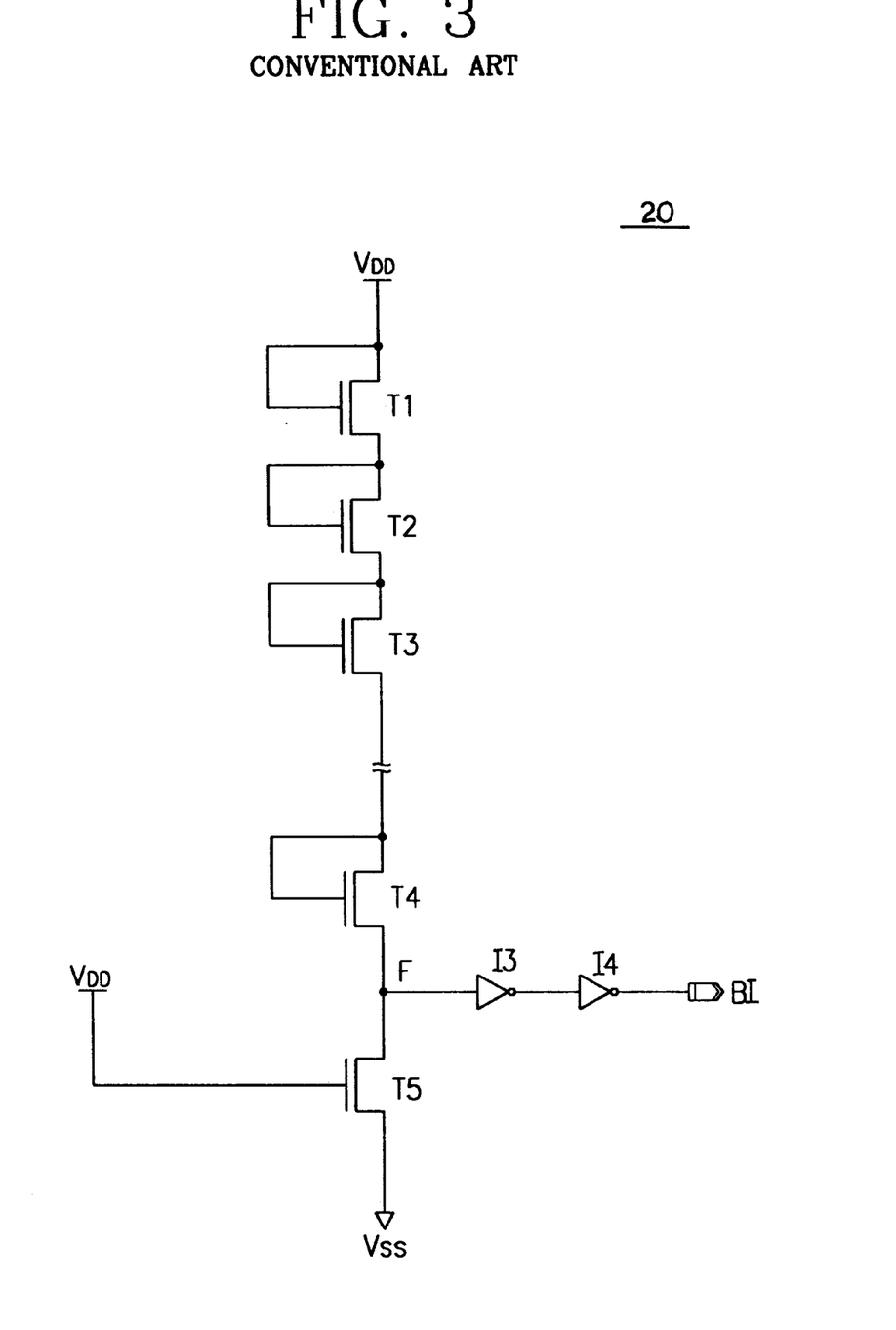
FIG. 3 is a detailed circuit diagram illustrating a burn-in signal generator in the circuit of FIG. 1.

As shown in FIG. 3, the burn-in signal generator 20 includes NMOS transistors T1 through T4 connected in series to a voltage $V_{DD}$, an NMOS transistor T5 having a gate connected to the power voltage $V_{DD}$, the source connected to a ground voltage $V_{SS}$, and the drain connected to the drain of the fourth NMOS transistor T4. Inverters I3 and I4 sequentially delay the signals from the node F to which the drain of the NMOS transistor T5 is connected. Here, the NMOS transistors T1 through T4 which are connected in series to the voltage $V_{DD}$ receive source inputs through the gate of the same.

In the burn-in signal generator 20, the number of NMOS transistors T1 through T4 are subject to the level of the voltage to be set. If a voltage higher than the set voltage level is applied, the NMOS transistors T1 through T4 are turned on, and the node F becomes a high level, so that the burn-in signals BI are outputted through the inverters I3 and I4.

Figure 4:
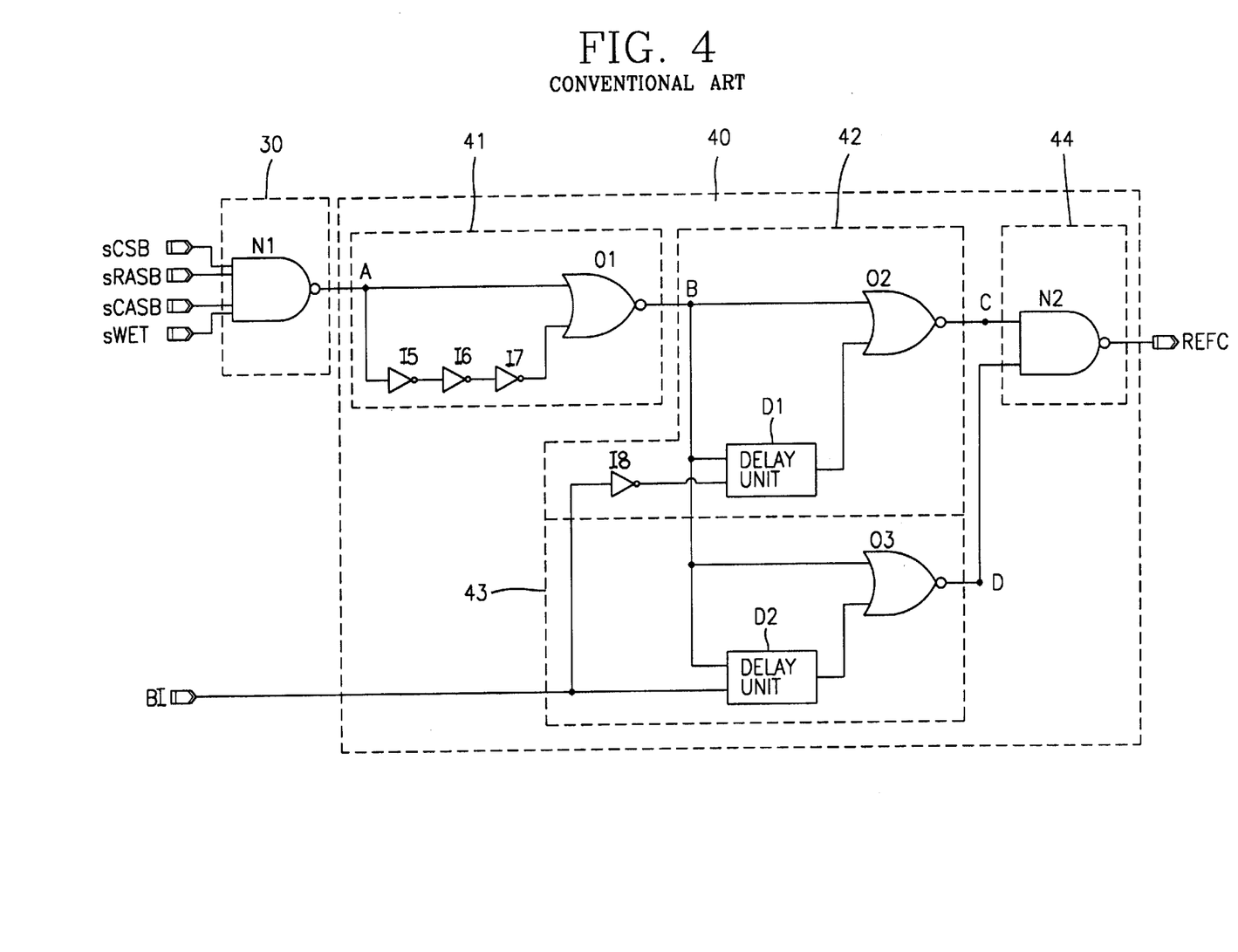
FIG. 4 is a detailed circuit diagram illustrating a refresh control signal generator in the circuit of FIG. 1.

As shown in FIG. 4, the command signal decoder 30 includes an NAND-gate N1 which receives four command signals sCSB, sRASB, sCASB, and sWET which are synchronized by the clock signal.

As shown in FIG. 4, the refresh control signal generator 40 includes a pulse generator 41 for generating pulses in accordance with a signal from the command signal decoder 30. A normal pulse expander 42 and burn-in pulse expander 43 expand the pulse signal from the pulse generator 41 in accordance with a burn-in signal BI from the burn-in signal generator 20. A control signal output unit 44 receives the signals from the normal pulse expander 41 and burn-in pulse expander 43 and outputs a refresh control signal.

The pulse generator 41 includes three inverters I5 through I7 which are connected in series for sequentially delaying and inverting the output signals from the command signal decoder 30, and a NOR-gate O1 for "NORing" (performing a logical NOR operation) the delayed and inverted signal from the inverters I5 through I7 and the output signal from the command signal decoder 30.

The normal pulse expander 42 includes a delay unit D1, which is enabled by the output from the inverter I8 for inverting the burn-in signal BI from the burn-in signal generator 20 and delaying the output from the pulse generator 41, and a NOR-gate O2 for NORing the output from the delay unit D1 and the output from the pulse generator 41.

The burn-in expander 43 includes a delay unit D2, which is enabled by the burn-in signal BI from the burn-in signal generator 20, for delaying the output from the pulse generator 41, and a NOR-gate O3 for NORing the output from the delay unit D2 and the output from the pulse generator 41.

The control signal output unit 44 includes a NAND-gate N2 for performing a "NANDing" (performing a logical NAND operation) operation in accordance with the outputs from the normal pulse expander 42 and the burn-in pulse expander 43, and outputting a refresh control signal REFC.

The operation of the conventional auto-refresh control circuit for a semiconductor device will now be explained with reference to the accompanying drawings.

Referring to FIGS. 5A–5E, when the refresh command signals sCSB, sRASB, sCASB and sWET (where "s" means synchronous, "B" means bar, and "T" means true), which are synchronized by the external clock signal CLK (FIG. 5A) are inputted into the NAND-gate N1 of the refresh command signal decoder 30, node A becomes a low level. The pulse generator 41, which receives the signal from the node A, generates pulses and transmits the same to node B.

When the burn-in signal BI from the burn-in signal generator 20 is at a low level, the output node D of the burn-in pulse expander 43 becomes a high level, and the signal from the output node C of the normal pulse expander 42 is inverted by the NAND-gate N2 as an auto-refresh control signal REFC.

Figure 5A:
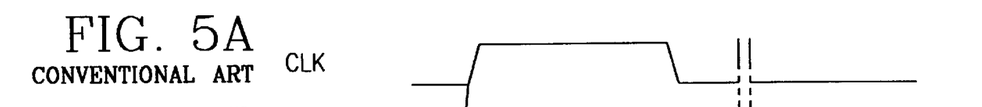
FIGS. 5A through 5E are waveform diagrams of signals from elements in the circuit of FIG. 1.
Figure 5B:
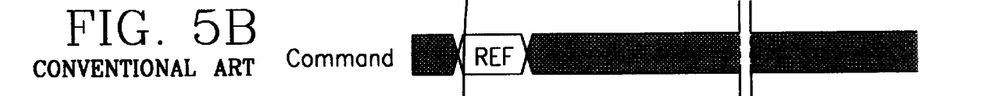
Figure 5C:
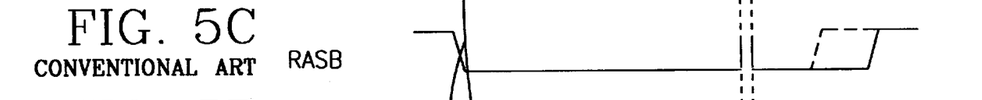
Figure 5D:
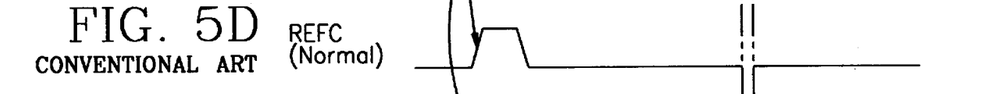

At this time, the pulse expansion by the normal pulse expander 42 as shown in FIG. 5D is determined by the delay unit D1 such that the minimum standard period of the auto-refresh cycle is satisfied.

Figure 5E:
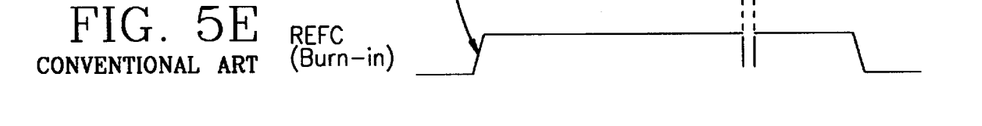

In addition, when the burn-in signal from the burn-in signal generator 20 is at a high level, the output node C of the normal pulse expander 43 becomes a high level, and the signal from the output node D of the burn-in pulse expander 43 is inverted by the NAND-gate N2 as a control signal REFC.

The pulse expansion by the burn-in pulse expander 43, as shown in FIG. 5E, is determined by the delay unit D2 based on the efficiency of the burn-in test.

Here, when the burn-in signal BI from the burn-in signal generator 20 is at a low level, the circuit is in the normal operation state, not in the burn-in state. In addition, when the burn-in signal BI is at a high level, the circuit is in the burn-in state.

As shown in FIGS. 5D and 5E, the auto-refresh control signal REFC (burn-in) is configured to have a pulse width that is greater than (a few or tens of times) the width of the pulse in the normal operation state, so that the memory array activation is extended, the burn-in test time can be shortened, and the construction of the test apparatus is simplified.

However, in the conventional auto-refresh control circuit, since the pulse width of the auto-refresh control signal REFC is fixed during the burn-in test, it is impossible to control the REFC signal. Therefore, it is impossible to effectively perform the burn-in test. Moreover, to generate a lengthy pulse, the area of the chip layout must be undesirably increased.

SUMMARY OF THE INVENTION

Accordingly, the present invention is directed to an auto-refresh control circuit for a semiconductor device that substantially obviates one or more of the problems due to limitations and disadvantages of the related art.

An object of the present invention is to provide an auto-refresh control circuit for a semiconductor device capable of more easily performing a package burn-in test.

Another object of the present invention is to provide an auto-refresh control circuit for a semiconductor device capable of controlling an auto-refresh control signal of a synchronous memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an auto-refresh control circuit for a semiconductor device includes a burn-in signal generator for detecting a burn-in test state and generating a burn-in signal, a synchronous buffer for synchronizing an asynchronous signal iRAS, which is obtained by inverting a phase of an externally inputted command signal RASB, and a command signal to a clock signal and generating a synchronous signal sRAS, a decoder for receiving a synchronous signal sRAS synchronized to a clock signal from the synchronous buffer and decoding the received signal to a refresh signal, and a refresh control signal generator, which is enabled in accordance with a burn-in signal BI from the burn-in signal generator and an asynchronous signal iRAS from the synchronous buffer for receiving a signal REF from the decoder and generating an auto-refresh control signal.

In another aspect of the present invention, an auto-refresh control circuit for a semiconductor device includes a burn-in signal generator detecting a burn-in test state and generating a burn-in signal; a synchronous buffer receiving a clock signal and an external signal and generating an asynchronous signal and a synchronous signal corresponding to the external signal, the synchronous buffer synchronizing the asynchronous signal to the clock signal; a decoder, coupled to the synchronous buffer, receiving control signals and the synchronous signal synchronized to the clock signal from the synchronous buffer and outputting a refresh signal; and a refresh control signal generator, coupled to the burn-in signal generator, synchronous buffer, and the decoder, receiving the refresh signal, the burn-in signal, and the asynchronous signal and generating an auto-refresh control signal.

In another aspect of the present invention, an auto-refresh control circuit for a semiconductor device comprises a burn-in signal generator detecting a burn-in test state and generating a burn-in signal; a synchronous buffer receiving a clock signal and an external signal and generating an asynchronous signal and a synchronous signal corresponding to the external signal, the synchronous buffer synchronizing the asynchronous signal to the clock signal; a decoder, coupled to the synchronous buffer, receiving control signals and the synchronous signal synchronized to the clock signal from the synchronous buffer and outputting a refresh signal, the refresh control signal generator includes a pulse generator, coupled to the decoder, receiving the refresh signal and generating a pulse signal; a pulse expander, coupled to the pulse generator, expanding the pulse signal from the pulse generator; and a control signal output unit, coupled to the pulse expander, receiving the asynchronous signal and the burn-in signal and outputting the auto-refresh control signal in accordance with a signal from the pulse expander; and a refresh control signal generator, coupled to the burn-in signal generator, synchronous buffer, and the decoder, receiving the refresh signal, the burn-in signal, and the asynchronous signal and generating an auto-refresh control signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 6:
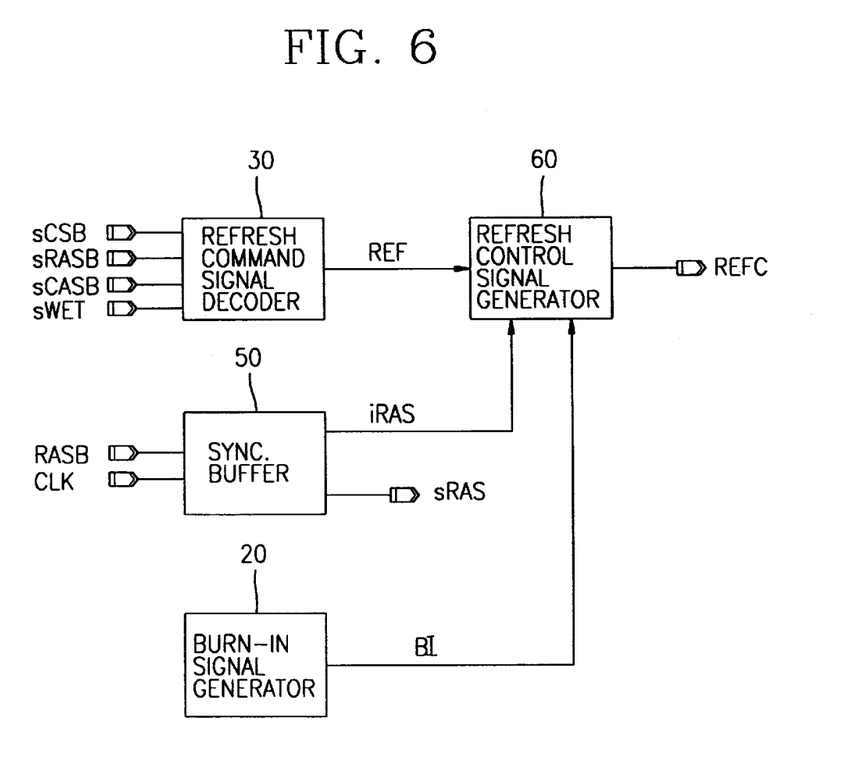
FIG. 6 is a block diagram illustrating an auto-refresh control circuit according to the present invention.

FIG. 6 illustrates an auto-refresh control circuit according to the present invention. Referring to FIG. 6, a burn-in signal generator 20 and a decoder 30 of the auto-refresh control circuit for a semiconductor device according to the present invention are configured in a same manner as in the conventional circuit.

The auto-refresh control circuit for a semiconductor device according to the present invention includes a synchronous buffer 50 for generating an asynchronous signal iRAS, which is obtained by inverting the phase of a command signal, and a signal sRAS synchronized by a clock signal when a command signal RASB is externally inputted. A refresh control signal generator 60, which is synchronized by a burn-in signal BI and an asynchronous signal iRAS from the burn-in signal generator 20 and the synchronous buffer 50, respectively, receives a refresh signal REF decoded by the decoder 30 and outputs a refresh control signal REFC.

Figure 7:
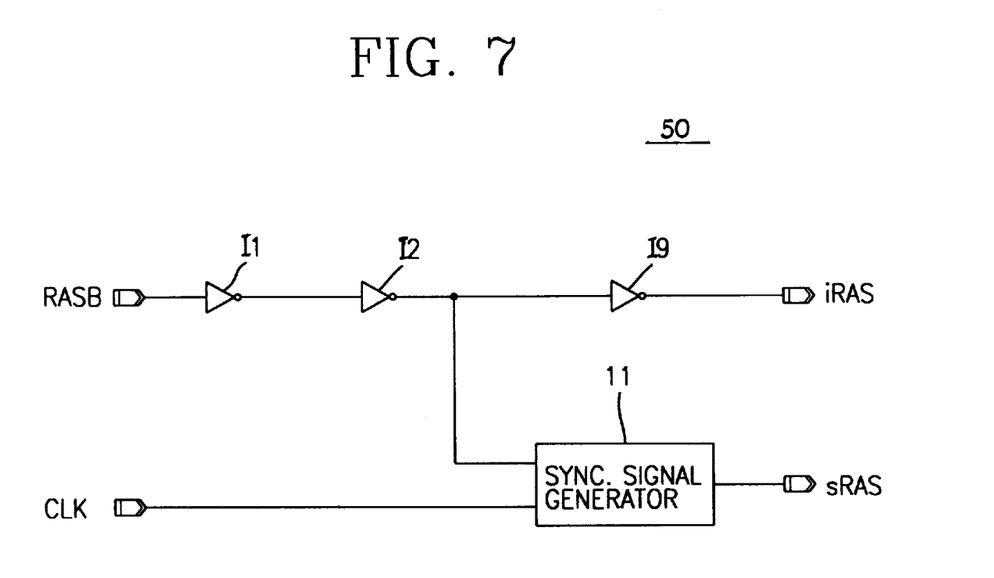
FIG. 7 is a detailed circuit diagram illustrating a synchronous buffer in the circuit of FIG. 6.

As shown in FIG. 7, the synchronous buffer 50 includes inverters I1 and I2, which are connected in series to each other, for sequentially delaying externally inputted command signals RASB. An inverter I9 inverts the delayed signal and outputs an asynchronous signal iRAS. A synchronous signal generator 11 synchronizes the outputs from the inverters I1 and I2 to a clock signal and outputs a synchronous signal sRAS.

Figure 8:
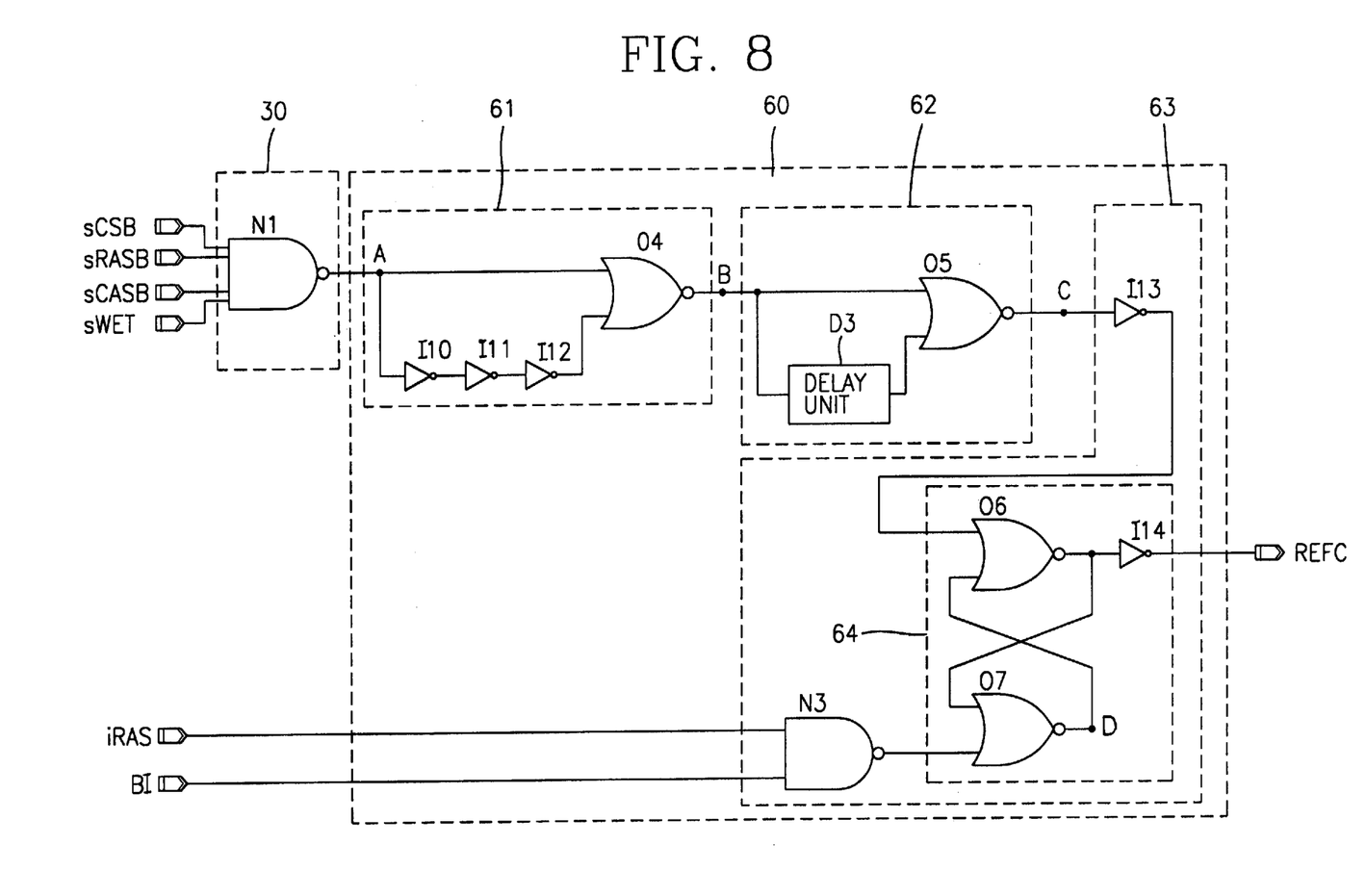
FIG. 8 is a detailed circuit diagram illustrating a refresh control signal generator in the circuit of FIG. 6.

As shown in FIG. 8, the refresh control signal generator 60 includes a pulse generator 61 for receiving a refresh signal REF decoded by the command signal decoder 30 and generating a pulse signal. A pulse expander 62 expands a pulse signal from the pulse generator 61. A control signal output unit 63, which is synchronized by the asynchronous signal iRAS and burn-in signal BI from the synchronous buffer 50 and the burn-in signal generator 20, respectively, outputs an auto-refresh control signal REFC in accordance with the output from the pulse expander 62.

The pulse generator 61 includes inverters I10 through I12, which are connected in series to each other, for delaying and inverting the output signal from the command signal decoder 30, and a NOR-gate O4 for receiving the signals inverted by the inverters I10 through I12 and the output signal from the command signal decoder 30.

The pulse expander 62 includes a delay unit D3 for delaying the output signal from the pulse generator 61, and a NOR-gate O5 for NORing the signal from the delay unit D3 and the output signal from the pulse generator 61. Here, the delay unit D3 is configured to expand a pulse.

The control signal output unit 63 includes an inverter I13 for inverting the pulse signal from the pulse expander 61, a NAND-gate N3 for NANDing the synchronous signal iRAS from the synchronous buffer 50 and the burn-in signal BI from the burn-in signal generator 20, and a latch unit 64 having two OR-gates O6 and O7 for receiving the outputs from the NAND-gate N3 and the inverter I13 and an inverter I14 for inverting the output from the OR-gate O6.

The operation of the auto-refresh control circuit for a semiconductor device according to the present invention will now be explained with reference to the accompanying drawings.

Figure 9A:
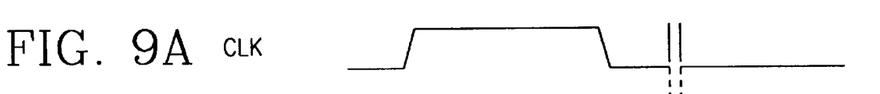
FIGS. 9A through 9H are waveform diagrams of signals from elements of an auto-refresh control circuit of FIG. 6 according to the present invention.
Figure 9B:
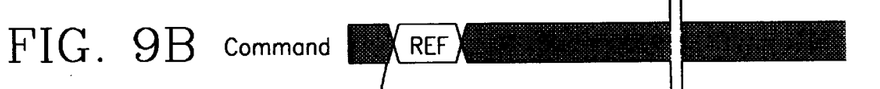
Figure 9C:
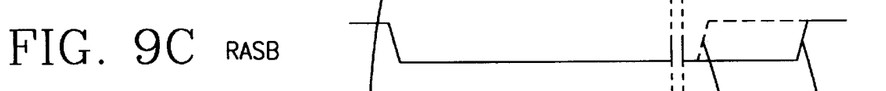
Figures 9D, 9E:
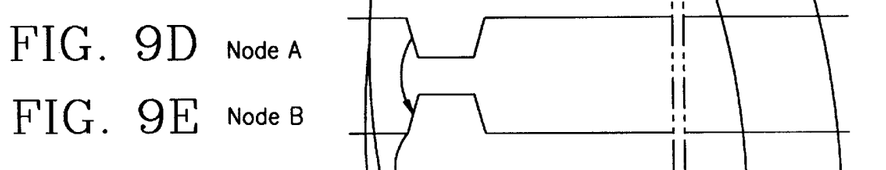
Figure 9F:
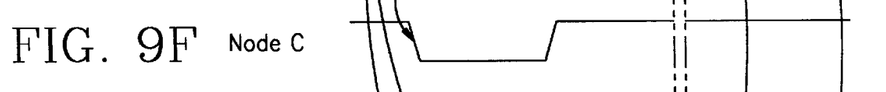

Referring to FIGS. 9A to 9E, when four auto-refresh command signals such as sCSB, sRASB, sCASB, and SWET, which are synchronized to the external clock signal CLK (FIG. 9A), are inputted into the NAND-gate N1 of the decoder 30 (FIGS. 9B and 9C), the output node A of the decoder 30 becomes a low level (FIG. 9D) and the output node B of the pulse generator 61 generates a pulse (FIG. 9E) due to the propagation delay from the inverters I10–I12. This pulse is expanded by the pulse expander 62 at node C (FIG. 9F), and is applied to the latch unit 64 as a refresh signal REF through the inverter I13.

When the burn-in signal BI is at a low level in the normal operation state, the output from the NAND-gate N3 becomes a high level, and the output from the node D becomes low level. The refresh signal REF outputted from the pulse expander 62 and inverted by the inverter I13 becomes an auto-refresh control signal REFC through the NOR-gate O6 and the inverter I14. The auto-refresh control signal has the same pulse width as the refresh signal REF.

Figure 9G:
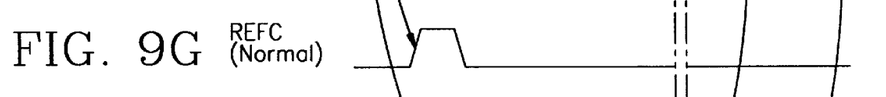

The pulse width of the auto-refresh control signal REFC having a low level burn-in signal BI, as shown in FIG. 9G, is determined by the delay unit D3 so that the minimum standard period of the auto-refresh cycle can be satisfied.

Figure 9H:
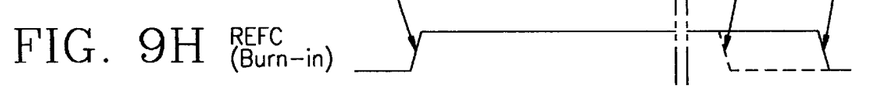

In addition, when the burn-in signal BI is at a high level (in a burn-in state), the output from the NAND-gate N3 of the control signal output unit 63 becomes a low level while the asynchronous signal iRAS from the synchronous buffer 50 is at a high level. The latch unit 64, which is preferably an RS flip-flop, is set by the refresh command signal REF (which is at a low state) from the command signal decoder 30, and the auto-refresh control signal REFC is expanded until the asynchronous signal iRAS is inverted to a low level, namely, until the asynchronous signal iRAS is inverted into a low level and then is reset. Thus, the expanded auto-refresh control signal REFC is outputted to the outside through the inverter I14.

Thus, when the iRAS signal and the BI signal are at high levels, then the iRAS signal maintains a high state until the internal RAS signal (iRAS) signal, which is controlled by the external RAS signal (RASB), transitions to a low level. Accordingly, the REFC signal is controlled both externally and asynchronously.

At this time, the pulse width of the auto-refresh control signal REFC, as shown in FIG. 9H, is determined based on the pulse width of the asynchronous signal iRAS from the synchronous buffer 50. Therefore, it is possible to externally and asynchronously vary the pulse width of the auto-refresh control signal REFC.

As described above, in the auto-refresh control circuit for a semiconductor device according to the present invention, it is possible to externally and asynchronously control an auto-refresh control signal for a package burn-in test for a synchronous memory in a layout area that is smaller than in conventional devices. Also, the same conventional burn-in test systems for asynchronous memories can be used for synchronous memories having the capability of controlling the refresh control signal externally and asynchronously in accordance with the present invention. Thus, package burn-in test for a synchronous memories can be easily done using conventional asynchronous memory test systems.

It will be apparent to those skilled in the art that various modifications and variations can be made in the auto-refresh control circuit for semiconductor device of the present invention without departing from the spirit or scope of the invention. Thus, it is intended that the present invention cover the modifications and variations of the invention provided they come within the scope of the appended claims and their equivalents.

What is claimed is:

1. An auto-refresh control circuit for a semiconductor device comprising:

a burn-in signal generator detecting a burn-in test state and generating a burn-in signal;

a synchronous buffer receiving a clock signal and an external signal and generating an asynchronous signal and a synchronous signal corresponding to the external signal, the synchronous buffer synchronizing the synchronous signal to the clock signal;

a decoder, coupled to the synchronous buffer, receiving control signals and the synchronous signal synchronized to the clock signal from the synchronous buffer and outputting a refresh signal; and a refresh control signal generator, coupled to the burn-in signal generator, synchronous buffer, and the decoder, receiving the refresh signal, the burn-in signal, and the asynchronous signal and generating an auto-refresh control signal.

2. The circuit according to claim 1, wherein the synchronous buffer includes:

a delay unit receiving the external signal and outputting a delayed external signal;

an inverting unit, coupled to the delay unit, inverting the delayed external signal and outputting the asynchronous signal; and a synchronous signal generator, coupled to the delay unit, synchronizing the delayed external signal to the clock signal and outputting the synchronous signal.

3. The circuit according to claim 2, wherein the delay unit includes a plurality of inverters in series.

4. The circuit according to claim 1, wherein the refresh control signal generator includes:

a pulse generator, coupled to the decoder, receiving the refresh signal and generating a pulse signal;

a pulse expander, coupled to the pulse generator, expanding the pulse signal from the pulse generator; and a control signal output unit, coupled to the pulse expander, receiving the asynchronous signal and the burn-in signal and outputting the auto-refresh control signal in accordance with a signal from the pulse expander.

5. The circuit according to claim 4, wherein the pulse generator includes:

a second delay unit delaying and inverting the refresh signal from the decoder; and a NOR-gate, coupled to the second delay unit, receiving a signal inverted by the second delay unit and the refresh signal from the decoder and generating the pulse signal.

6. The circuit according to claim 4, wherein the pulse expander includes:

a second delay unit delaying the pulse signal; and a NOR-gate, coupled to the second delay unit, NORing a delayed pulse signal from the second delay unit and the pulse signal from the pulse generator.

7. The circuit according to claim 4, wherein the control signal output unit includes:

an inverter unit inverting a pulse signal from the pulse expander;

a NAND logic unit NANDing the asynchronous signal from the synchronous buffer and the burn-in signal from the burn-in signal generator; and a latch unit, coupled to the inverter unit and the NAND logic unit, receiving an output from the NAND logic unit and an output from the inverter unit and outputting the auto-refresh control signal.

8. The circuit according to claim 7, wherein the latch unit includes an RS flip-flop.

9. The circuit according to claim 7, wherein the latch unit is set in accordance with the refresh signal from the decoder and asynchronously reset in accordance with the asynchronous signal from the synchronous buffer.

10. The circuit according to claim 1, wherein a pulse width of the auto-refresh control signal is externally and asynchronously varied.

11. The circuit according to claim 1, wherein a pulse width of the asynchronous signal from the synchronous buffer determines a pulse width of the auto-refresh control signal.

12. An auto-refresh control circuit for a semiconductor device comprising:

a burn-in signal generator detecting a burn-in test state and generating a burn-in signal;

a synchronous buffer receiving a clock signal and an external signal and generating an asynchronous signal and a synchronous signal corresponding to the external signal, the synchronous buffer synchronizing the synchronous signal to the clock signal;

a decoder, coupled to the synchronous buffer, receiving control signals and the synchronous signal synchronized to the clock signal from the synchronous buffer and outputting a refresh signal, the refresh control signal generator includes:

a pulse generator, coupled to the decoder, receiving the refresh signal and generating a pulse signal;

a pulse expander, coupled to the pulse generator, expanding the pulse signal from the pulse generator; and a control signal output unit, coupled to the pulse expander, receiving the asynchronous signal and the burn-in signal and outputting the auto-refresh control signal in accordance with a signal from the pulse expander.

13. The circuit according to claim 12, wherein the synchronous buffer includes:

a delay unit receiving the external signal and outputting a delayed external signal;

an inverting unit, coupled to the delay unit, inverting the delayed external signal and outputting the asynchronous signal; and a synchronous signal generator, coupled to the delay unit, synchronizing the delayed external signal to the clock signal and outputting the synchronous signal.

14. The circuit according to claim 13, wherein the delay unit includes a plurality of inverters in series.

15. The circuit according to claim 12, wherein the pulse generator includes:

a second delay unit delaying and inverting the refresh signal from the decoder; and a NOR-gate, coupled to the second delay unit, receiving a signal inverted by the second delay unit and the refresh signal from the decoder and generating the pulse signal.

16. The circuit according to claim 12, wherein the pulse expander includes:

a second delay unit delaying the pulse signal; and a NOR-gate, coupled to the second delay unit, NORing a delayed pulse signal from the second delay unit and the pulse signal from the pulse generator.

17. The circuit according to claim 12, wherein the control signal output unit includes:

an inverter unit inverting a pulse signal from the pulse expander;

a NAND logic unit NANDing the asynchronous signal from the synchronous buffer and the burn-in signal from the burn-in signal generator; and a latch unit, coupled to the inverter unit and the NAND logic unit, receiving an output from the NAND logic unit and an output from the inverter unit and outputting the auto-refresh control signal.

18. The circuit according to claim 17, wherein the latch unit includes an RS flip-flop.

19. The circuit according to claim 17, wherein the latch unit is set in accordance with the refresh signal from the decoder and asynchronously reset in accordance with the asynchronous signal from the synchronous buffer.

20. The circuit according to claim 12, wherein a pulse width of the auto-refresh control signal is externally and asynchronously varied.

21. The circuit according to claim 12, wherein a pulse width of the asynchronous signal from the synchronous buffer determines a pulse width of the auto-refresh control signal.

* * * * *